(12) United States Patent
Jiang et al.

(10) Patent No.: US 12,096,579 B2
(45) Date of Patent: Sep. 17, 2024

(54) BASE STATION FOR MOUNTING ON CEILING

(71) Applicants: Zhengzhou Wanmayun Electronic Technology CO., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Liu-Jun Jiang, Shenzhen (CN); Bo-Duo Yuan, Shenzhen (CN)

(73) Assignees: Zhengzhou Wanmayun Electronic Technology CO., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 131 days.

(21) Appl. No.: 17/940,156

(22) Filed: Sep. 8, 2022

(65) Prior Publication Data
US 2023/0240032 A1 Jul. 27, 2023

(30) Foreign Application Priority Data
Jan. 24, 2022 (CN) .......................... 202210081130.7

(51) Int. Cl.
*H05K 5/03* (2006.01)
*H05K 5/02* (2006.01)
*H04W 88/08* (2009.01)

(52) U.S. Cl.
CPC ............. *H05K 5/03* (2013.01); *H05K 5/0247* (2013.01); *H04W 88/08* (2013.01)

(58) Field of Classification Search
CPC ........ H05K 5/03; H05K 5/069; H05K 5/0247; H05K 7/1061; H05K 7/1404; H05K 7/026;
(Continued)

(56) References Cited

U.S. PATENT DOCUMENTS

| 3,447,348 A | * | 6/1969 | Dauenbaugh | ........... E05B 37/00 |
| | | | | 70/285 |
| 11,246,199 B2 | * | 2/2022 | Hou | ..................... F21V 33/0056 |
| 2006/0202849 A1 | * | 9/2006 | Cook | ................... G08B 29/181 |
| | | | | 340/693.7 |

FOREIGN PATENT DOCUMENTS

| CN | 210771172 U | * | 6/2020 | ............. F16M 11/04 |
| CN | 112615205 B | * | 3/2022 | ............. H01R 13/52 |

* cited by examiner

*Primary Examiner* — Jerry Wu
*Assistant Examiner* — Andrea Saucedo Cuevas
(74) *Attorney, Agent, or Firm* — ScienBiziP, P.C.

(57) ABSTRACT

A ceiling-mounted base station with aesthetic contours includes a housing assembly and a shielding assembly. The housing assembly includes a first housing and a second housing connected to the first housing. The first housing includes first portion, third portion, and second portion connected in that order. The first portion and the second portion are disposed on opposite surfaces of the third portion. The third portion defines a cable hole. The shielding assembly is disposed on the second portion and connected to the second portion or the third portion. The shielding assembly, the second portion, and the third portion cooperatively define a shielding cavity with an opening facing the exterior, the shielding cavity can receive cables.

17 Claims, 12 Drawing Sheets

(58) Field of Classification Search
CPC .......... H05K 5/0217; H05K 7/12; H05K 7/14; H05K 7/1401; H04W 88/08; H01R 13/52; H01R 13/502; H01R 13/516; H02G 3/10
See application file for complete search history.

BASE STATION FOR MOUNTING ON CEILING

FIELD

The subject matter herein generally relates to base stations, and more particularly, to a base station for mounting on ceiling.

BACKGROUND

Base stations are interface devices for allowing mobile devices to access the Internet. For indoor applications, the base stations may have a ceiling-mounted configuration. Such a base station receives power or signals from a cable (such as a power line or a network cable), the cable connecting with the base station is inserted into a hole defined on the ceiling.

However, when the cable has a certain length, the cable may be partially exposed outside the base station after being connected to the base station. The exposed cable affects the appearance, and dust may accumulate thereon. Furthermore, damages may happen to the exposed cable. Therefore, there is room for improvement in the art.

BRIEF DESCRIPTION OF THE DRAWINGS

Implementations of the present technology will now be described, by way of embodiment, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
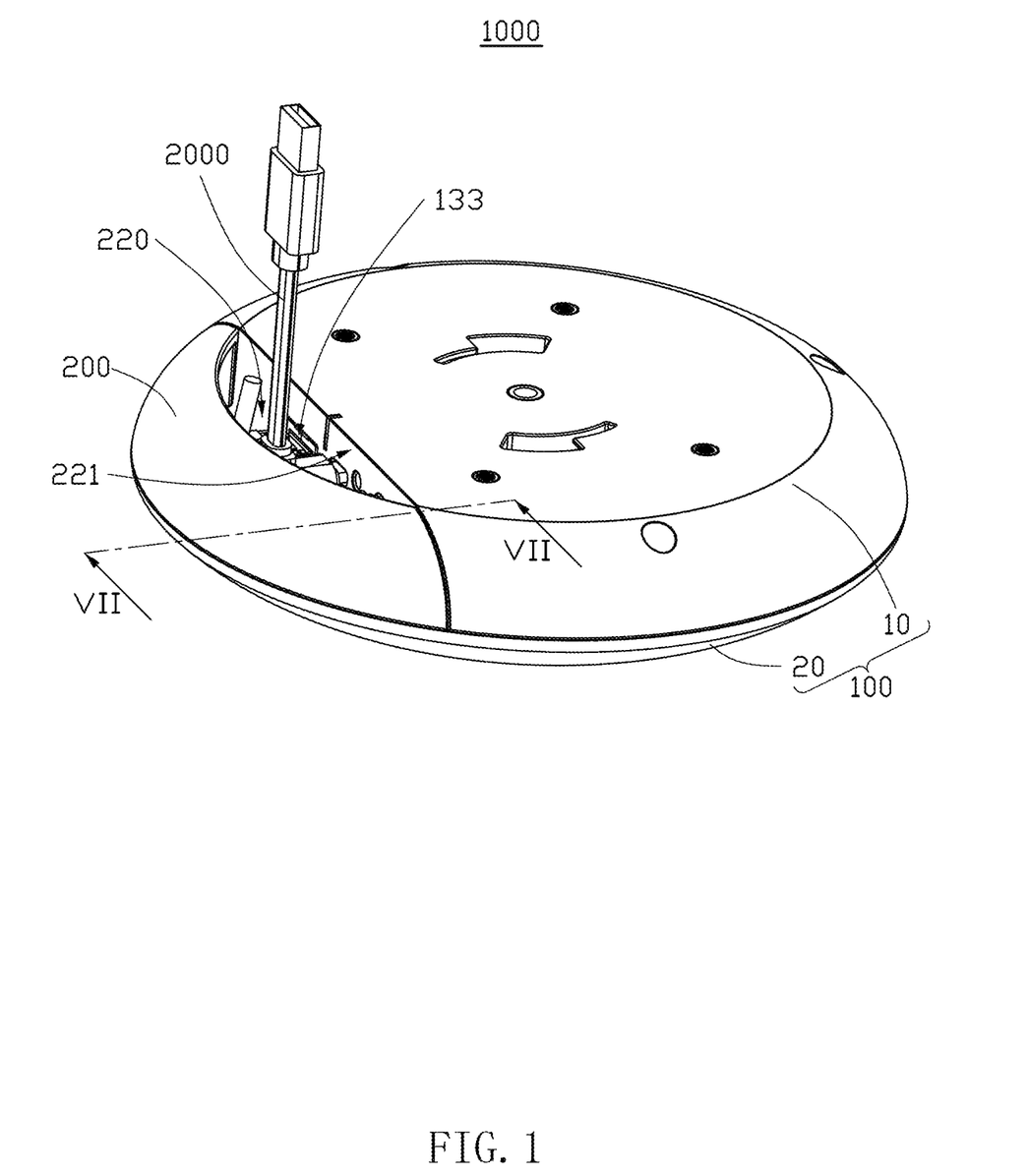
FIG. 1 is a diagrammatic view of a base station according to an embodiment of the present disclosure.
Figure 2:
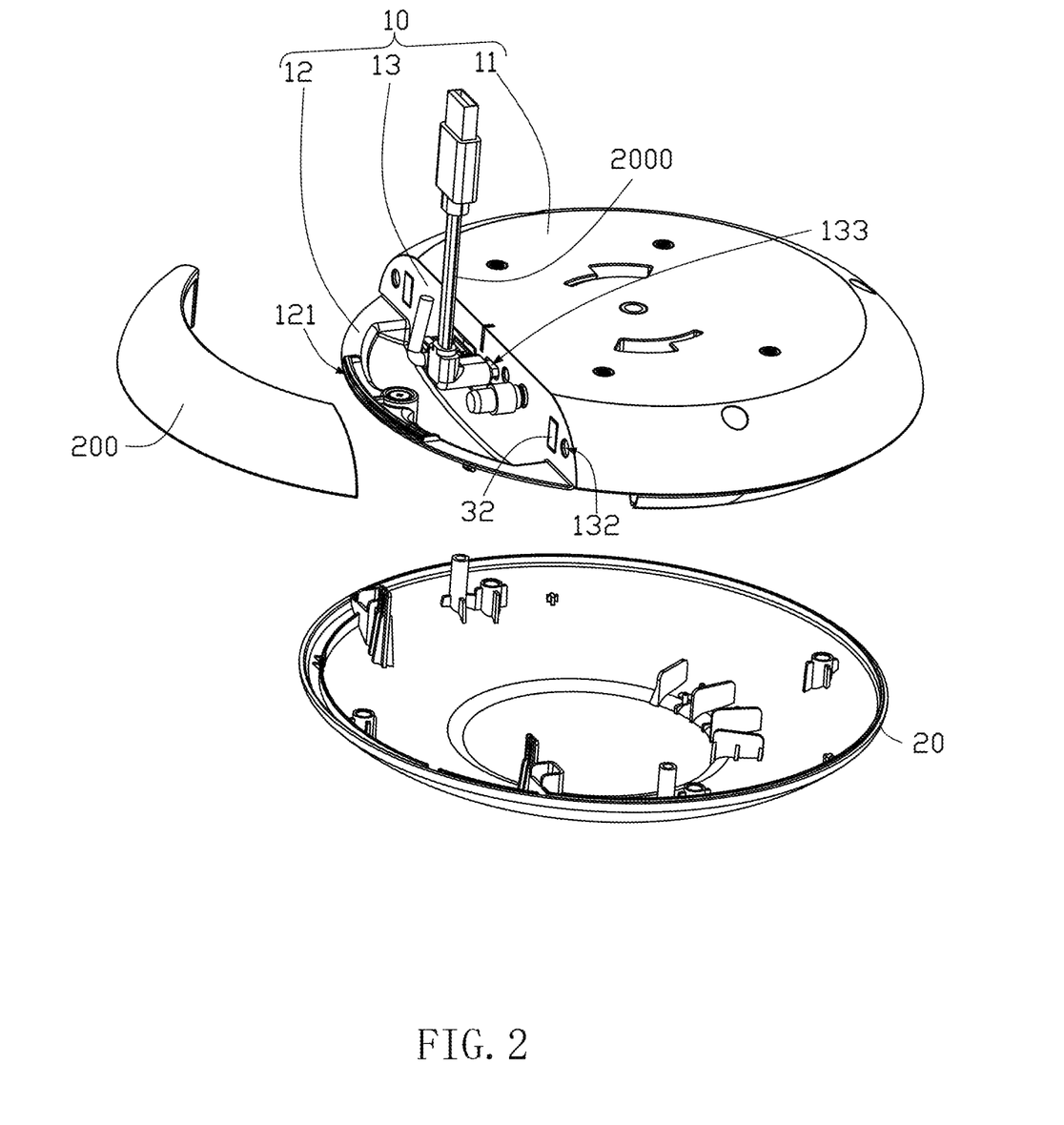
FIG. 2 is an exploded view of the base station of FIG. 1.

Referring to FIGS. 1 and 2, a base station 1000 for mounting on ceiling (not shown) is provided according to an embodiment of the present disclosure. The base station 1000 includes a housing assembly 100 and a shielding assembly 200. The housing assembly 100 includes a first housing 10 and a second housing 20 connected to the first housing 10. The shielding assembly 200 is disposed on the first housing 10. The shielding assembly 200 and the first housing 10 cooperatively define a shielding cavity 220. The shielding cavity 220 has an opening 221. The first housing 10 defines at least one cable hole 133. An end of an external cable 2000 (such as a power line, a network cable, or cable from an antenna) enters the shielding cavity 220 through the opening 221, and is then inserted into one cable hole 133. The other end of the external cable 2000 is disposed outside the shielding cavity 220. Thus, a large portion of the external cable 2000 can be received in the shielding cavity 220 to improve the appearance, and dust on the external cable 2000 and entry of dust into the interior is reduced. Damage to the external cable 2000 is also avoided. In at least one embodiment, the first housing 10 defines a plurality of cable holes 133 for different kinds of external cables 2000 to insert into.

The housing assembly 100 may be substantially circular, square, or polygonal. Referring to FIGS. 1 and 2, in at least one embodiment, the housing assembly 100 is substantially circular. Specifically, each of the first housing 10 and the second housing 20 is substantially circular. The first housing 10 and the second housing 20 can be connected together by clamping, fastening, or gluing.

The first housing 10 includes a first portion 11, a second portion 12, and a third portion 13 connected between the first portion 11 and the second portion 12. The first portion 11 and the second portion 12 are not coplanar. The first portion 11 and the second portion 12 are disposed on opposite surfaces of the third portion 13. Thus, a stepped structure is formed among the first portion 11, the third portion 13, and the second portion 12. The cable hole 133 is defined on the third portion 13. The shielding assembly 200 is disposed on the second portion 12. The shielding assembly 200, the second portion 12, and the third portion 13 cooperatively define the shielding cavity 220.

In at least one embodiment, the first portion 11 and the second portion 12 are parallel to each other, and the third portion 13 is perpendicularly connected between the first portion 11 and the second portion 12. Each of the first portion 11, the second portion 12, and the third portion 13 is a plate. When viewing from a direction perpendicular to the first portion 11 or the second portion 12, the first portion 11 and the second portion 12 cooperatively form a circular outline, and the shielding assembly 200 is substantially an arc and chord of the circular outline. In another embodiment, the third portion 13 may be inclined between the first portion 11 and the second portion 12.

Figure 3:
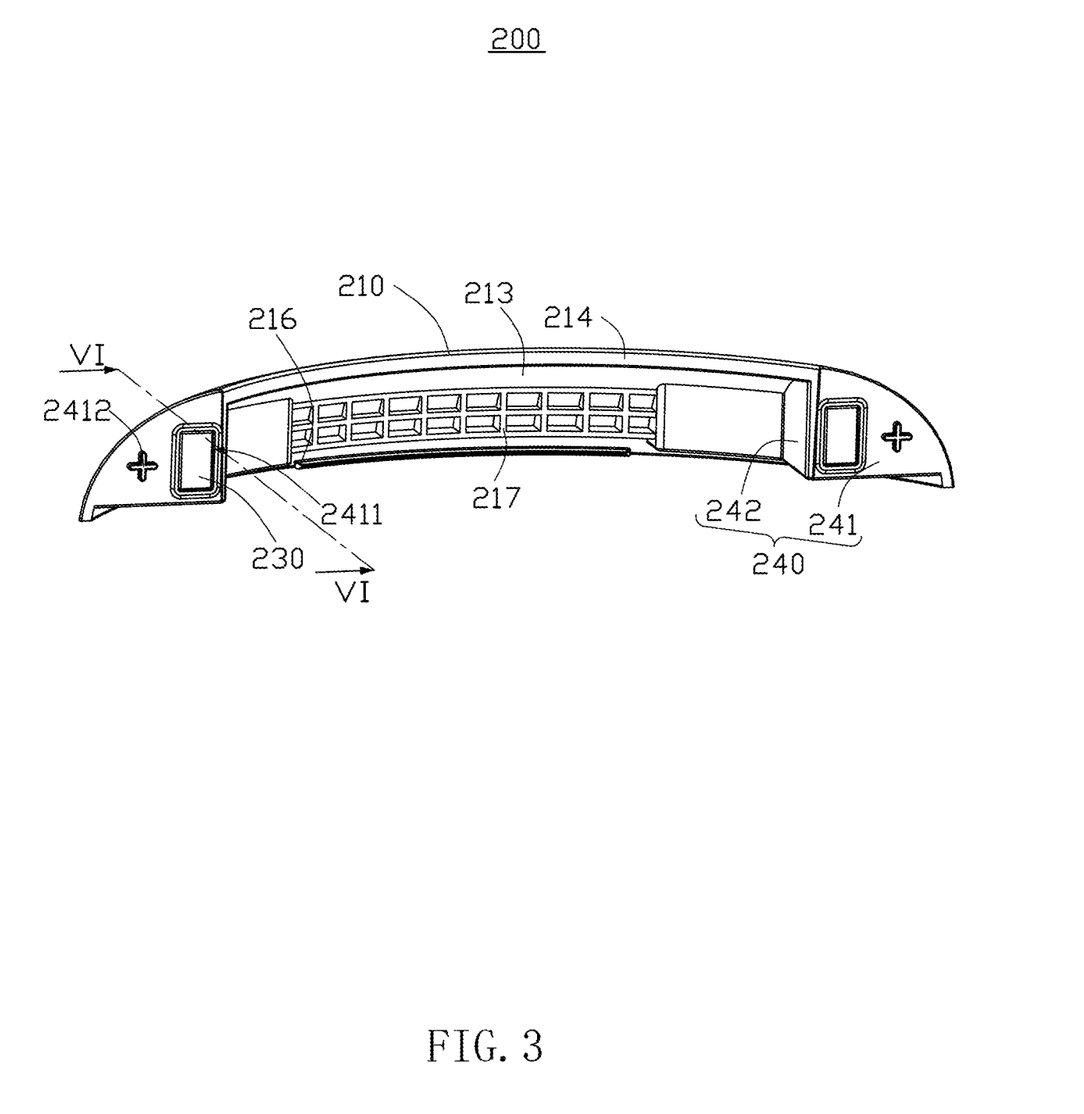
FIG. 3 is a diagrammatic view of a shielding assembly of the base station of FIG. 1.
Figure 4:
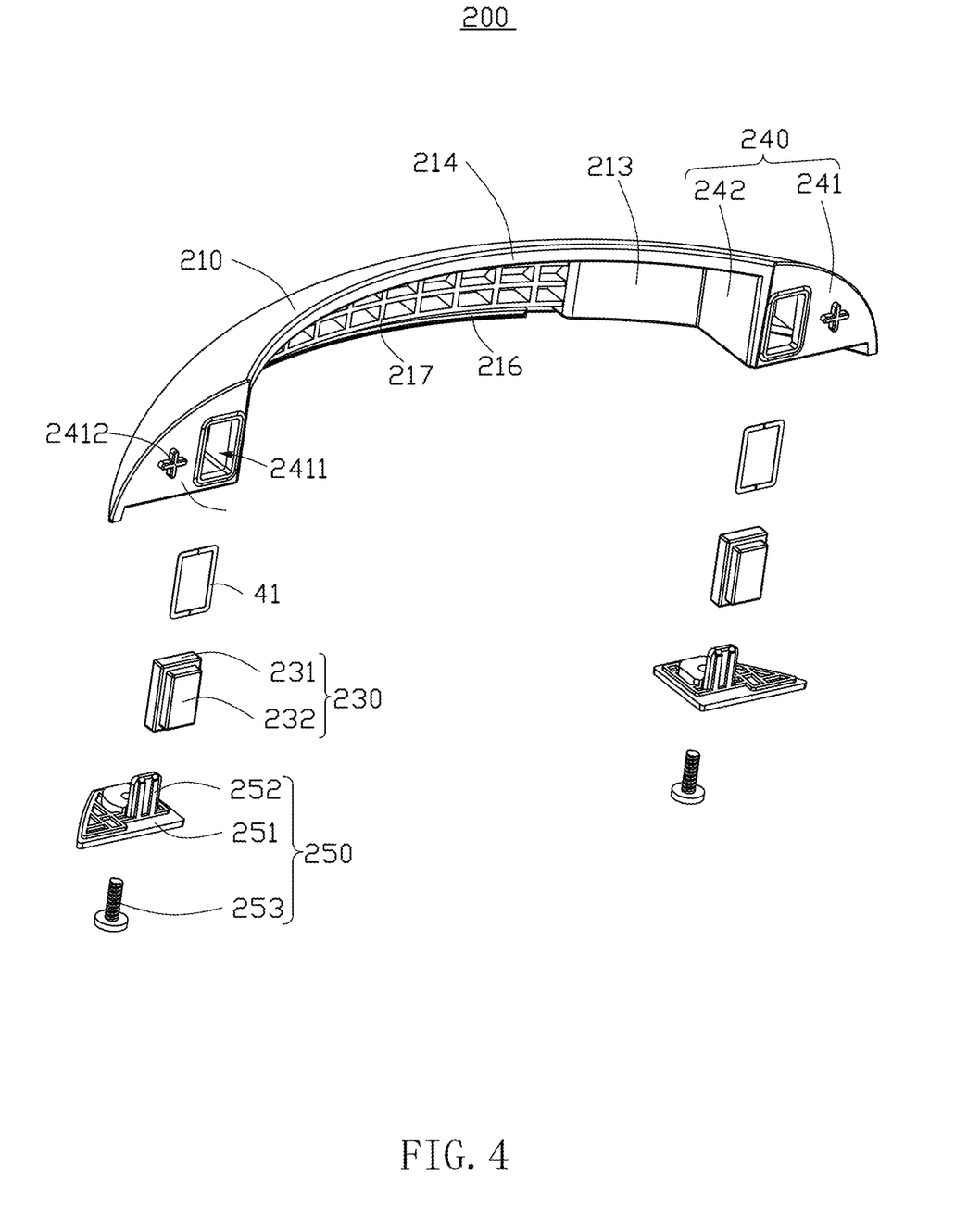
FIG. 4 is an exploded view of the shielding assembly of FIG. 3.
Figure 5:
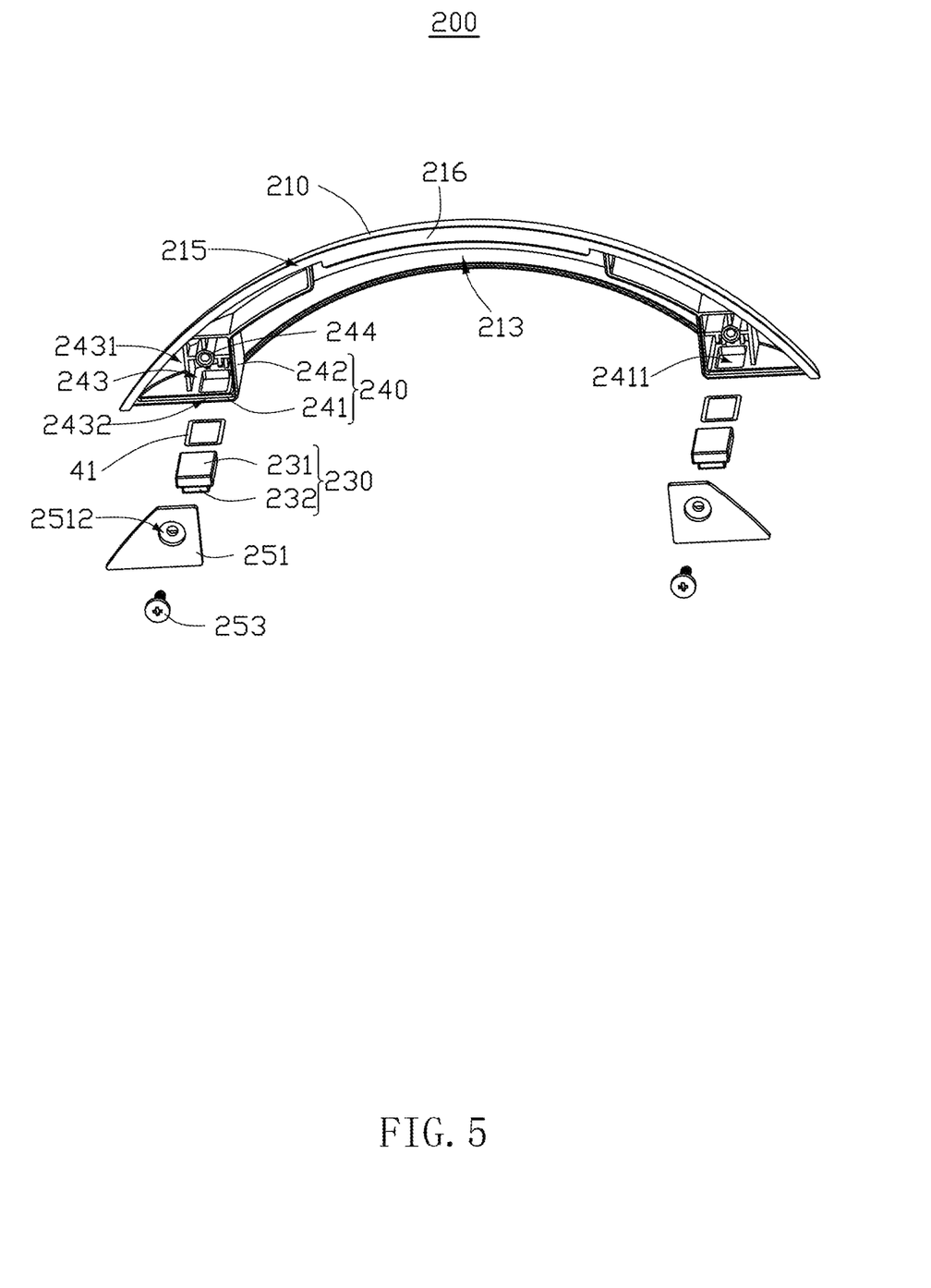
FIG. 5 is similar to FIG. 4, but showing the shielding assembly from another angle.

Referring to FIGS. 3 to 5, the shielding assembly 200 includes a shielding plate 210, two first magnets 230, two fixing portions 240, and two mounting portions 250. The two fixing portions 240 are connected to the shielding plate 210. The two mounting portions 250 are also connected to the shielding plate 210. The two first magnets 230 are connected to the two fixing portions 240.

The shielding plate 210 has an inner surface 213 facing the third portion 13. Each fixing portion 240 includes a first plate 241 and a second plate 242 connected to the first plate 241. The first plates 241 of the two fixing portions 240 are connected to opposite ends of the inner surface 213. Each of the first plates 241 is in contact with the third portion 13. Each second plate 242 is connected between the corresponding first plate 241 and the inner surface 213. A first receiving cavity 243 (see FIG. 5) is defined among each first plate 241, the corresponding second plate 242, and the inner surface 213.

Each first plate 241 defines a first opening 2411 communicating with the corresponding first receiving cavity 243. Each first magnet 230 is received in the corresponding first receiving cavity 243 and exposed from the first opening 2411. In at least one embodiment, each first magnet 230 includes a first magnetic block 231 and a second magnetic block 232 protruding from a surface of the first magnetic block 231. The first magnetic block 231 is received in the first receiving cavity 243. The second magnetic block 232 is exposed from the first opening 2411.

Figure 7:
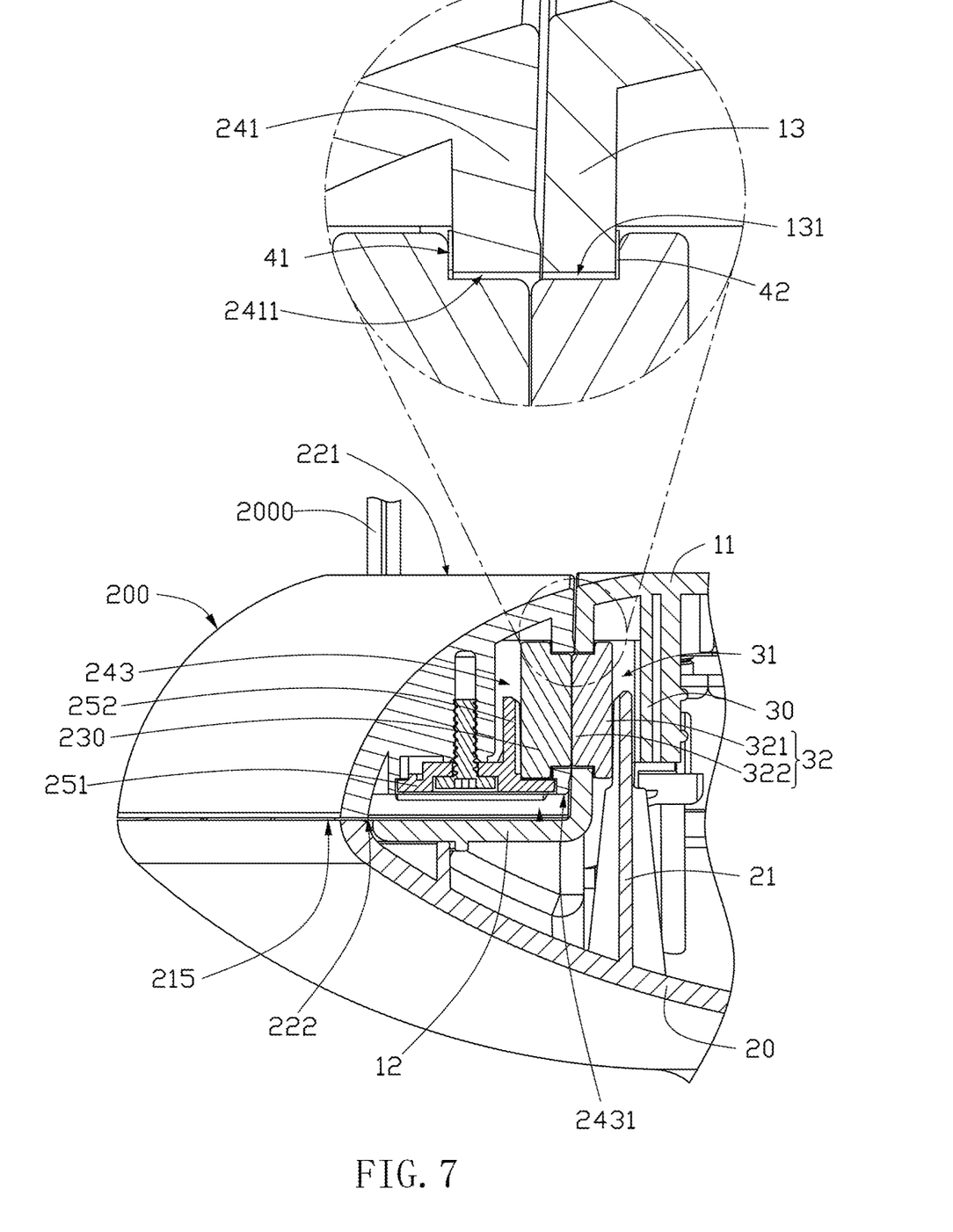
FIG. 7 is a cross-sectional view along VII-VII of FIG. 1.

Referring to FIGS. 4, 5 and 7, in at least one embodiment, the first receiving cavity 243 has a mounting port 2431 facing the second portion 12. Each mounting portion 250 includes a fixing plate 251 and a supporting plate 252 fixed on the fixing plate 251. The fixing plate 251 is fixed in the mounting port 2431 and supports the first magnetic block 231. The supporting plate 252 is received in the first receiving cavity 243. The first magnetic block 231 is clamped between the first plate 241 and the supporting plate 252. Thus, each first magnet 230 is fixed in the first receiving cavity 243. In at least one embodiment, the supporting plate 252 is perpendicular to the fixing plate 251. In at least one embodiment, a first adhesive layer 41 is further disposed between the first magnetic block 231 and the corresponding first plate 241. The first adhesive layer 41 fixes the first magnet 230 to the corresponding first plate 241. Thus, the first magnet 230 is more firmly mounted to the first plate 241.

Figure 8:
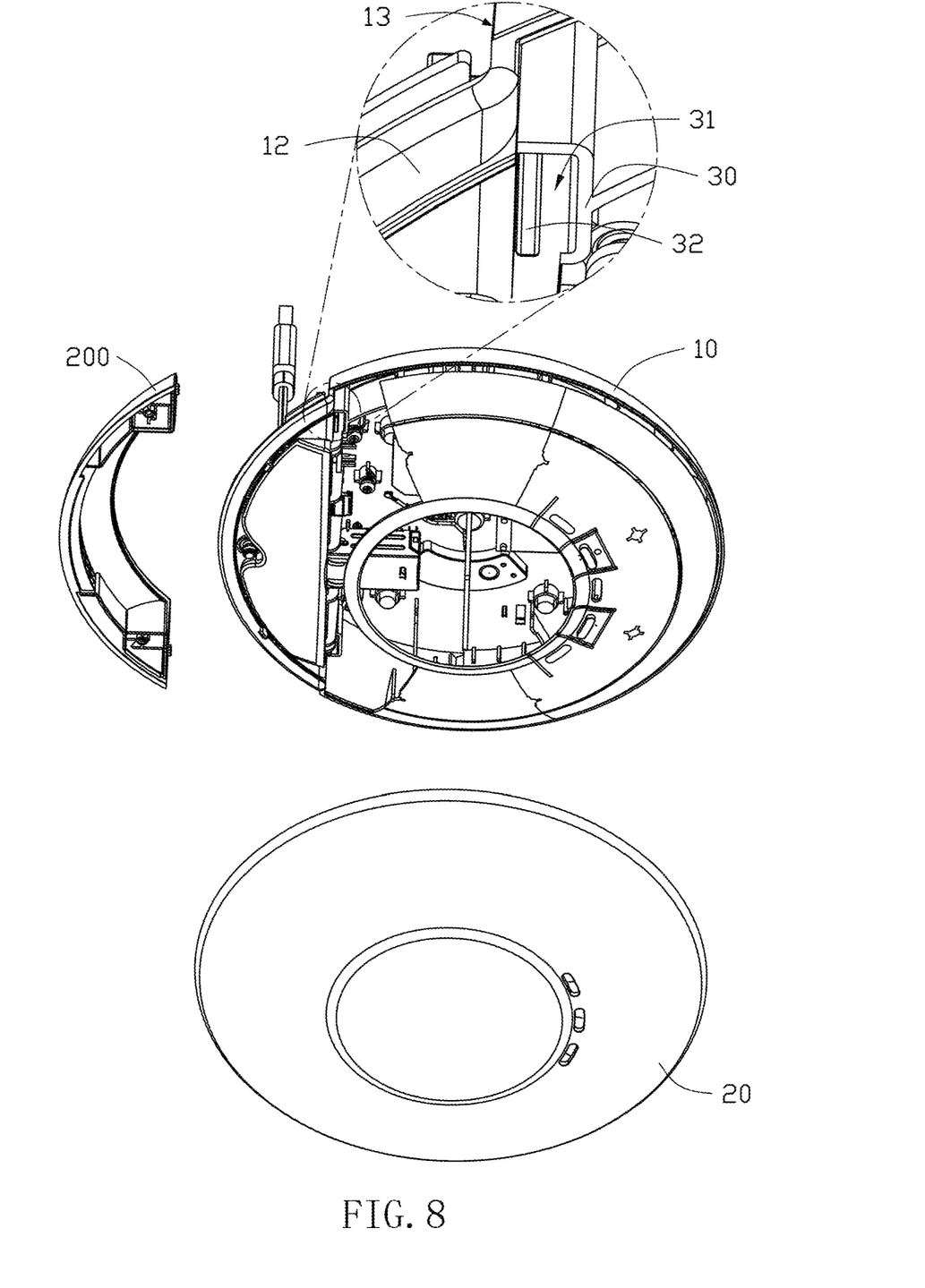
FIG. 8 is similar to FIG. 2, but showing the base station from another angle.

Referring to FIGS. 7 and 8, in at least one embodiment, a first limiting plate 30 is provided on the first portion 11, and disposed on a side of the third portion 13 away from the shielding plate 210. The first limiting plate 30 and the third portion 13 cooperatively define a second receiving cavity 31 with an opening facing the second housing 20. The second magnet 32 is received in the second receiving cavity 31. The third portion 13 further defines a second opening 131 corresponding to the first opening 2411. The second magnet 32 includes a third magnetic block 321 and a fourth magnetic block 322 protruding from a surface of the third magnetic block 321. The third magnetic block 321 is received in the second receiving cavity 31. The fourth magnetic block 322 is exposed from the second opening 131. As such, the second magnetic block 232 and the fourth magnetic block 322 attract each other, thereby fixing the shielding plate 210 to the third portion 13. In at least one embodiment, a second adhesive layer 42 is applied between the third magnetic block 321 and the third portion 13. The second adhesive layer 42 fixes the second magnet 32 on the third portion 13. A fastening plate 21 is also provided on a surface of the second housing 20 facing the first housing 10. The fastening plate 21 extends into the second receiving cavity 31. The third magnetic block 321 is clamped between the third portion 13 and the fastening plate 21. Thus, the second magnet 32 is more firmly mounted to the third portion 13.

Referring to FIGS. 2 to 4, in at least one embodiment, a positioning protrusion 2412 is provided on each first plate 241. The third portion 13 defines a positioning groove 132 for receiving the positioning protrusion 2412, improving the alignability of each first magnet 230 and the second corresponding magnet 32. The positioning protrusion 2412 may be crisscross in shape.

When installing the base station 1000 on the ceiling, the shielding plate 210 is disposed on the first housing 10 of the housing assembly 100 to form the shielding cavity 220. At this time, the first magnet 230 is aligned with and attracts the second magnet 32, thereby fixing the shielding assembly 200 to the first housing 10. An end of the external cable 2000 is inserted into the cable hole 133, and the end of the external cable 2000 is inserted into a cable outlet on the ceiling. Then, the free length of the external cable 2000 between its two ends can be bent and received in the shielding cavity 220. When disassembling the base station 1000, an external force can be directly applied to the base station 1000 to separate the first magnets 230 from the second magnets 32. Such a disassembling process is convenient and tool-free.

Figure 6:
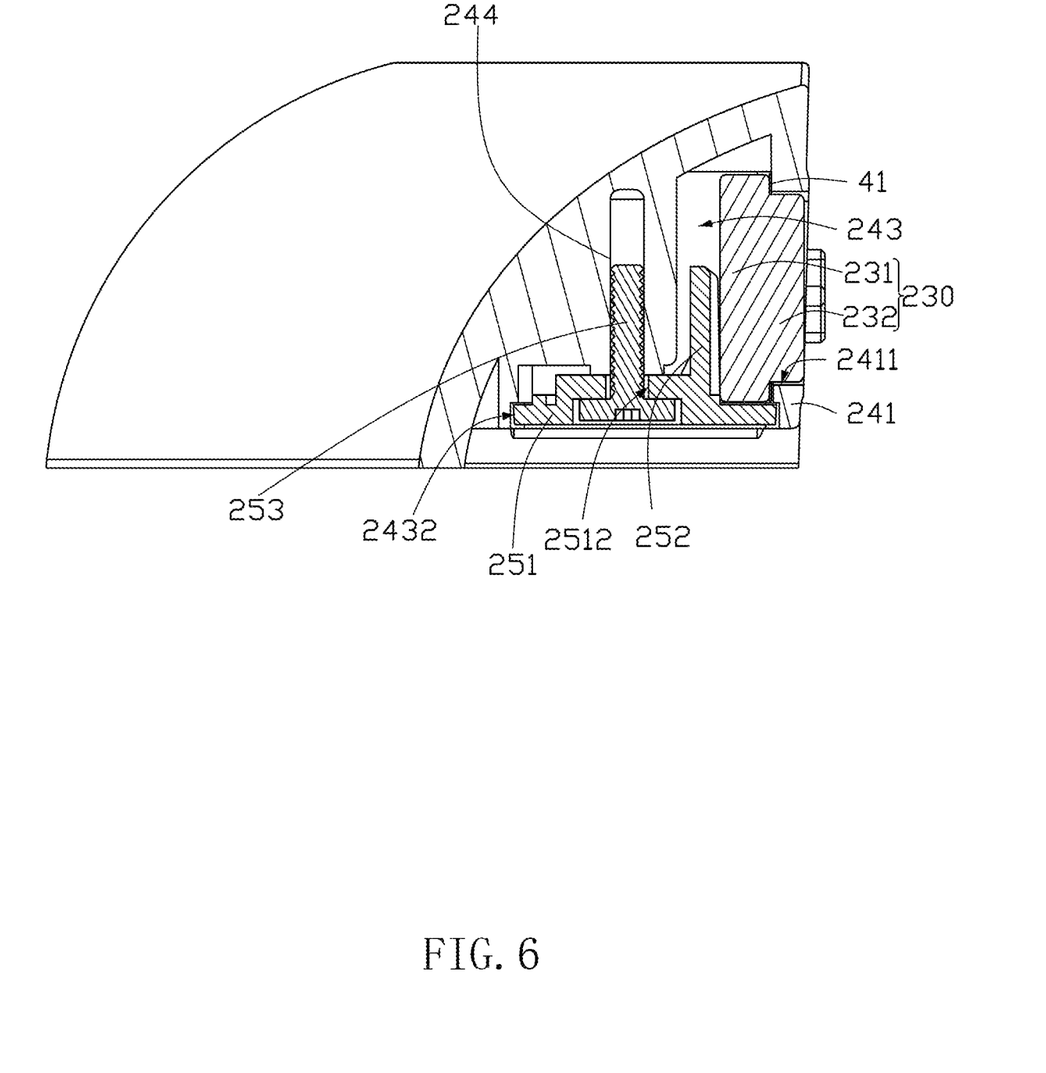
FIG. 6 is a cross-sectional view along VI-VI of FIG. 3.

Referring to FIGS. 5 and 6, in at least one embodiment, the shielding plate 210 further includes a hollow post 244 received in the first receiving cavity 243. The hollow post 244 protrudes from the inner surface 213 and extends in a direction perpendicular to the second portion 12. Each mounting portion 250 further includes a fastener 253 (such as a screw). The fixing plate 251 defines a mounting hole 2512 allowing the fastener 253 to pass through. The fastener 253 passes through the mounting hole 2512 and is then inserted into the hollow post 244, so as to fix each mounting portion 250 on the shielding plate 210.

In at least one embodiment, the first plate 241, the second plate 242, and the shielding plate 210 cooperatively define a recess 2432 at the mounting port 2431. The recess 2432 is used to receive the fixing plate 251. Thus, the fixing plate 251 is accurately fixed at the mounting port 2431, automatically aligning the mounting hole 2512 with the hollow post 244.

Referring to FIGS. 2 to 5, in at least one embodiment, a buckle 216 is provided on a bottom edge of the inner surface 213 of the shielding plate 210. An edge of the second portion 12 away from the third portion 13 defines a buckle groove 121. The buckle 216 can be received in the buckle groove 121, which allows the shielding plate 210 to be pre-mounted on the first housing 10. In at least one embodiment, the buckle 216 is arranged in a center area of the bottom edge of the shielding plate 210, and extends along one end of the shielding plate 210 to the other end of the shielding plate 210. Thus, a stable triangular structure is formed at the junction of each first magnet 230 and the corresponding second magnet 32 and the junction of the buckle 216 and the buckle groove 121, which improves the connection stability between the shielding assembly 200 and the first housing 10 and prevents the external cable 2000 from pushing the shielding assembly 200 away from the first housing 10.

Referring to FIGS. 3 to 5 and 7, in at least one embodiment, the shielding plate 210 further has a first surface 214 connected to a top edge of the inner surface 213. The opening 221 is defined between the first surface 214 and the junction of the third portion 13 and the first portion 11. The shielding plate 210 further has a second surface 215 connected to the bottom edge of the inner surface 213. The second surface 215 faces and is in contact with the second portion 12. When both the shielding plate 210 and the third portion 13 are orthogonally projected on the second portion 12, the first surface 214 is disposed between the second surface 215 and the third portion 13. That is, a size of the opening 221 is smaller than a size of a port 222 (see FIG. 7) formed by the bottom edge of the inner surface 213 and the third portion 13. Thus, the shielding plate 210 can block more external dust from being accumulated on the external cable 2000.

Referring to FIGS. 3 to 5, in at least one embodiment, the inner surface 213 may be an arc surface concaved inwardly. Thus, a size of the shielding cavity 220 is increased for receiving the external cable 2000. Reinforcing ribs 217 may also be provided on the inner surface 213 to improve the structural strength of the shielding plate 210. The reinforcing ribs 217 may be in form of grids.

Figure 9:
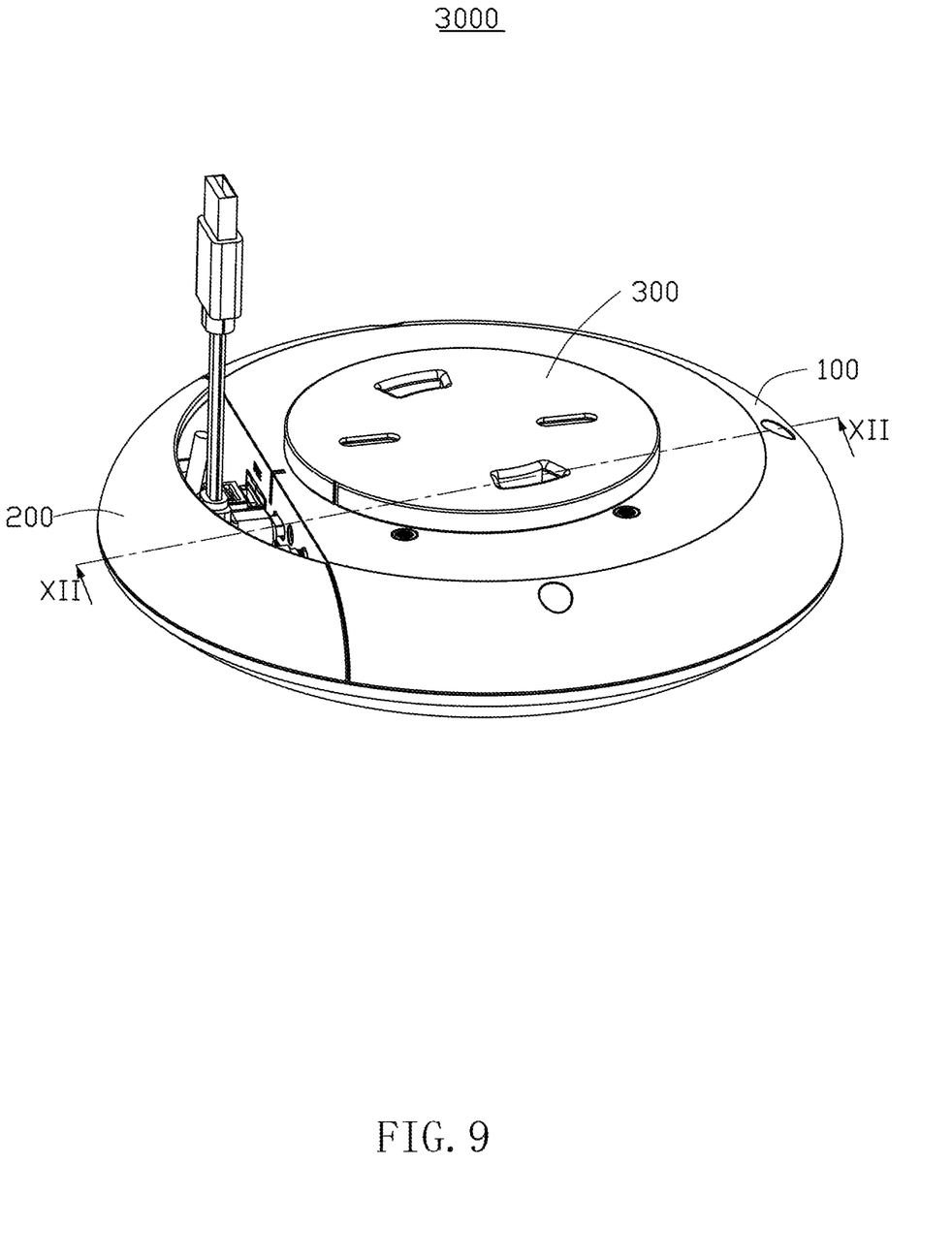
FIG. 9 is a diagrammatic view of a base station according to another embodiment of the present disclosure.

Referring to FIG. 9, a base station 3000 is also provided according to another embodiment of the present disclosure. Different from the base station 1000, the base station 3000 further includes a mounting base 300 detachably fixed on the first housing 10. The base station 3000 is mounted on the ceiling through the mounting base 300 by bolts for example.

Figure 10:
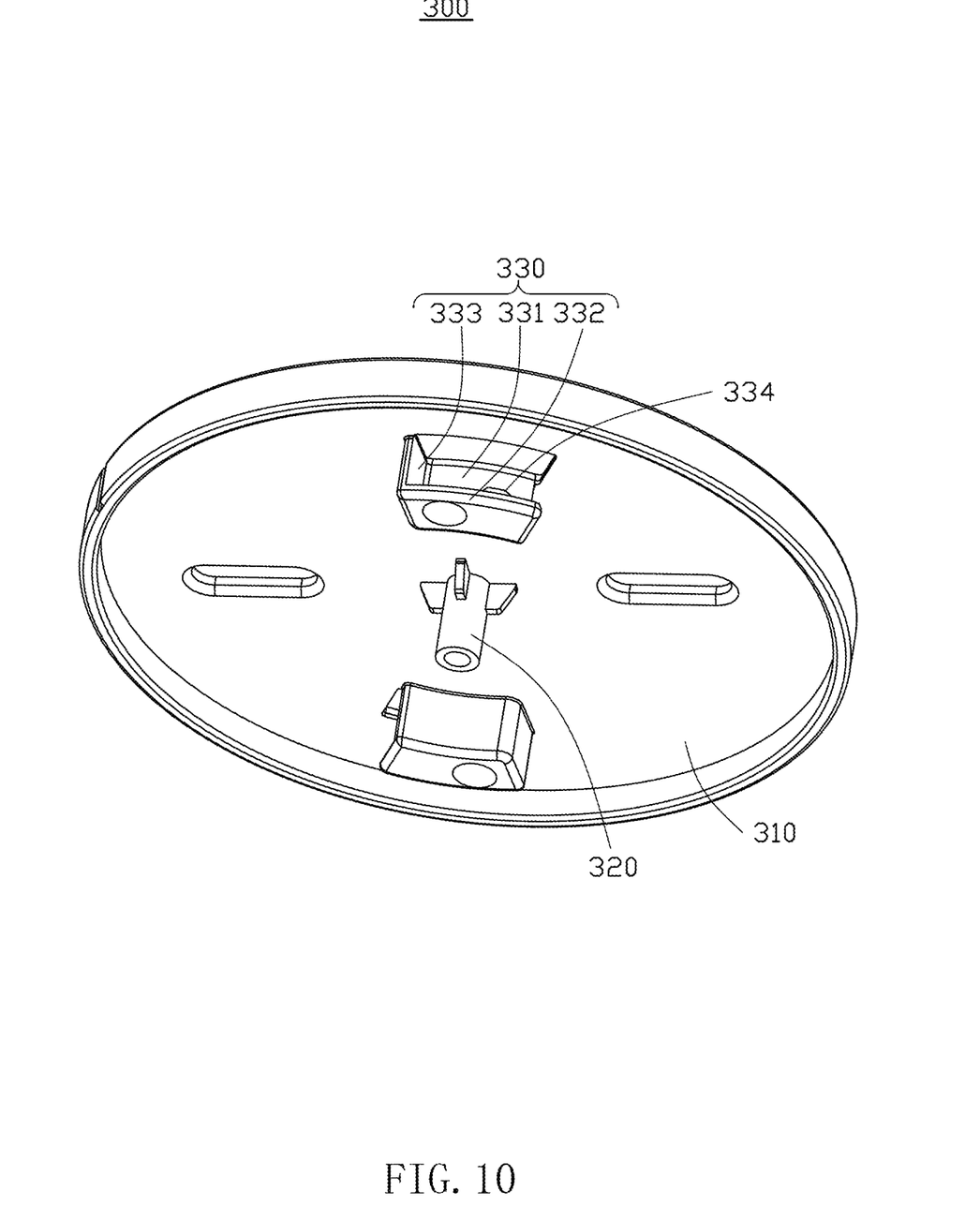
FIG. 10 is a diagrammatic view of a mounting base of the base station FIG. 9.
Figure 11:
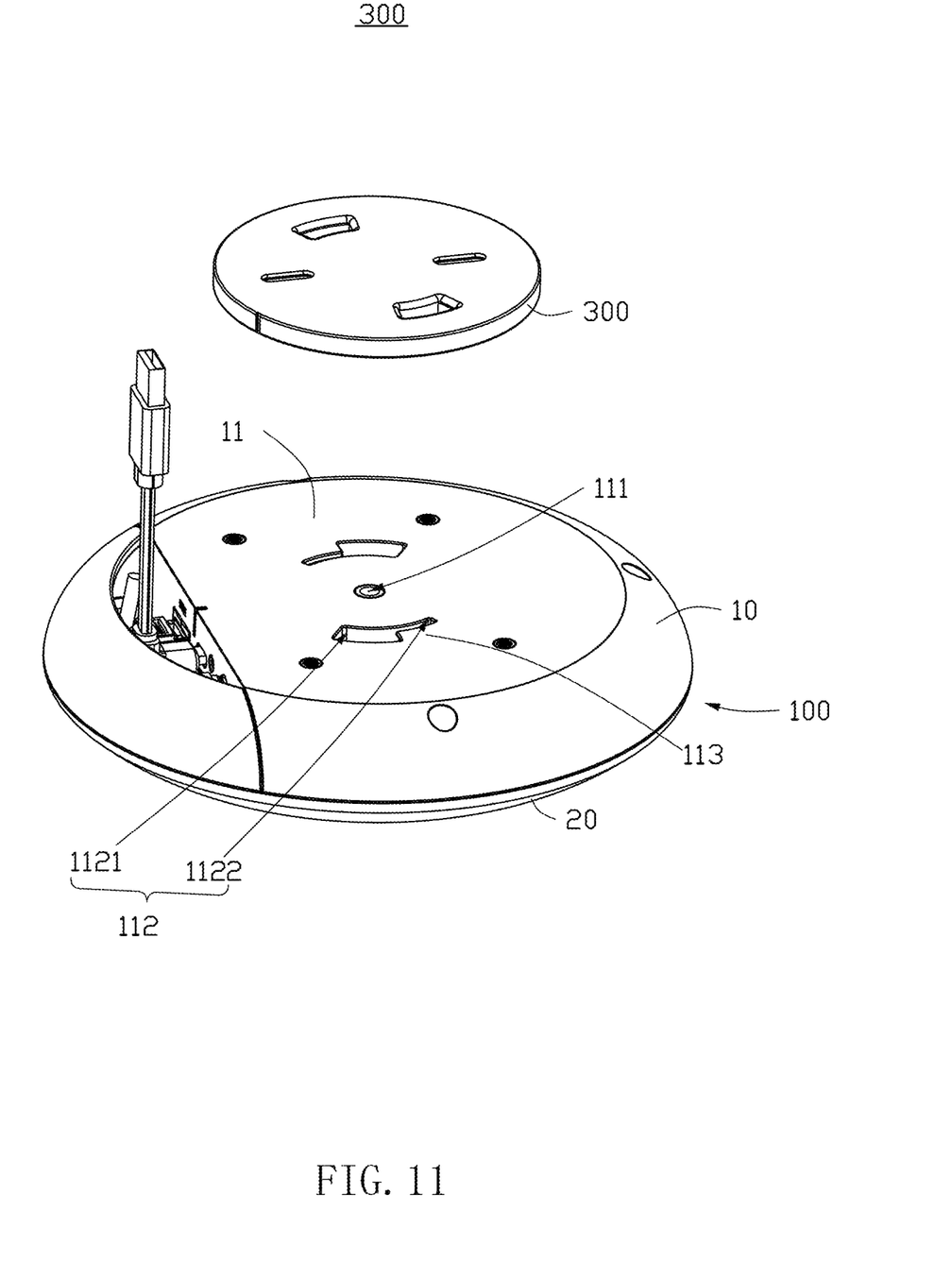
FIG. 11 is an exploded view of the base station of FIG. 9.

Referring to FIGS. 10 and 11, the mounting base 300 includes a base plate 310, a positioning column 320, and two rotating buckles 330. The positioning column 320 protrudes from a surface of the base plate 310 facing the first housing 10. Each rotating buckle 330 protrudes from the surface of the base plate 310 facing the first housing 10. Referring to FIG. 11, the first portion 11 of the first housing 10 defines a central hole 111 for receiving the positioning column 320 and two rotating grooves 112 for receiving the two rotating buckles 330. Each rotating groove 112 is arced in shape. The two rotating grooves 112 may be disposed at opposite sides of the central hole 111. The central hole 111 is at the center of a circle defined by the two rotating grooves 112. Each rotating buckle 330 can rotate in the corresponding rotating groove 112 to detachably fix the mounting base 300 to the housing assembly 100. Each rotating groove 112 includes a first end 1121 and a second end 1122 opposite to the first end 1121. The first end 1121 and the second end 1122 are disposed along the extending direction of the rotating groove 112 (that is, the rotating direction of each rotating buckle 330).

Referring to FIG. 10, each rotating buckle 330 includes a first rotating portion 331, a second rotating portion 332, and a clamping portion 333. An end of the first rotating portion 331 is fixed on the base plate 310, and the second rotating portion 332 is connected to the other end of the first rotating portion 331. The second rotating portion 332 is substantially parallel to the base plate 310. An end of the clamping portion 333 is fixed on the base plate 310, and the other end of the clamping portion 333 is connected to the second rotating portion 332. The base plate 310, the first rotating portion 331, the second rotating portion 332, and the clamping portion 333 together define an open structure which faces a side away from the positioning column 320. The first portion 11 further includes a second limiting plate 113 covering the second end 1122 of the rotating groove 112. The second limiting plate 113 includes a limiting end 1131 facing the first end 1121.

When installing the mounting base 300 on the housing assembly 100, the positioning column 320 is first received in the central hole 111, and the two rotating buckles 330 are received in the rotating grooves 112 at the same time. Then, the housing assembly 100 is rotated, causing each rotating buckle 330 to rotate in the corresponding rotating groove 112 until the second rotating portion 332 is below the second limiting plate 113 and the clamping portion 333 abuts against the limiting end 1131 of the second limiting plate 113. When disassembling the mounting base 300 from the housing assembly 100, the housing assembly 100 is rotated in the reverse direction, and the second rotating portion 332 moves away from the second limiting plate 113. Thus, each rotating buckle 330 disengages from the corresponding rotating groove 112. The mounting base 300 and the housing assembly 100 are detachably connected together through the engagement of the rotating buckles 330 and the rotating grooves 112, which facilitates rapid and convenient installation of the base station 3000.

Figure 12:
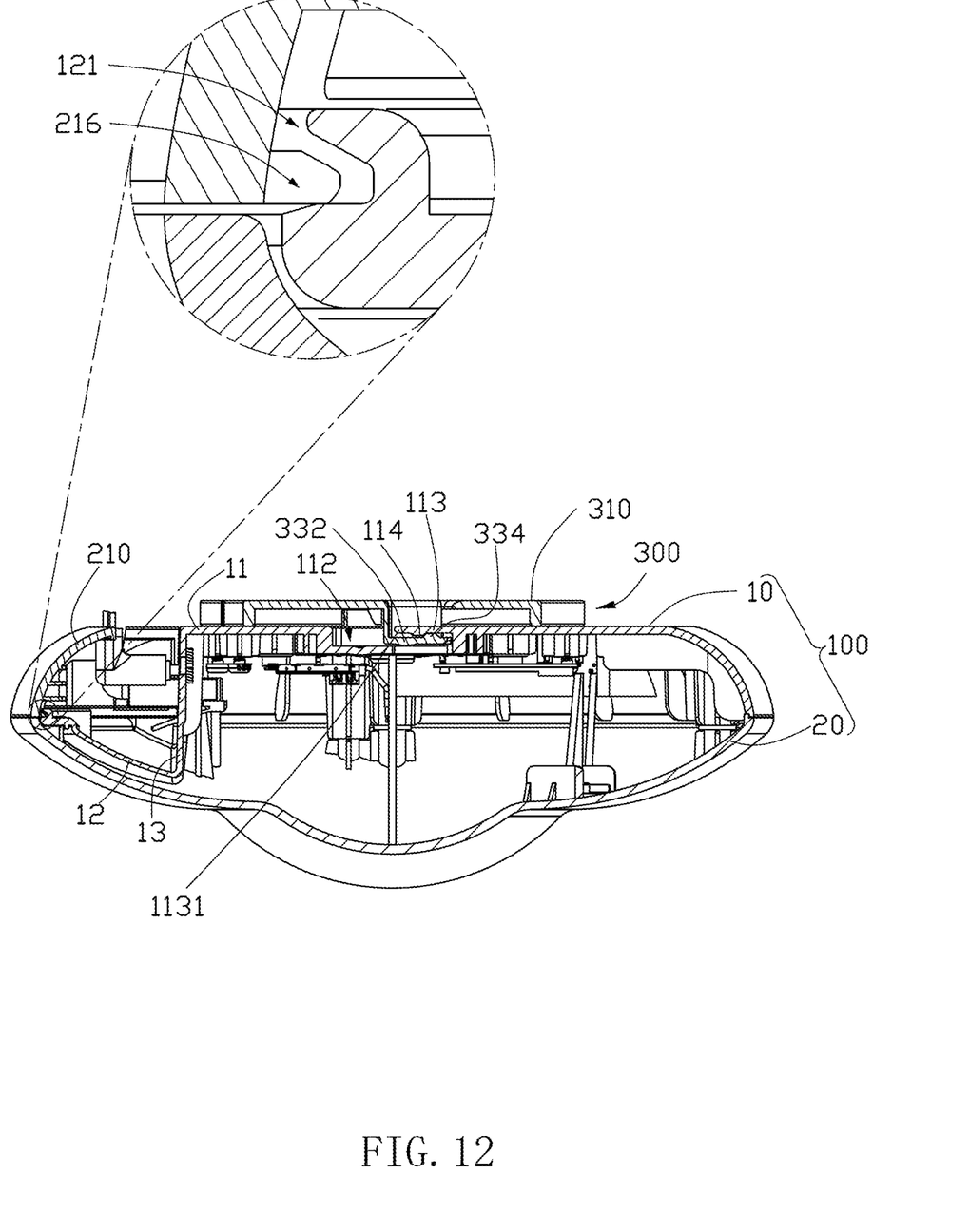
FIG. 12 is a cross-sectional view along XII-XII of FIG. 9.

Referring to FIG. 12, in at least one embodiment, a first bump 334 is provided on a surface of the second rotating portion 332 facing the second limiting plate 113. A second bump 114 is also provided on the second limiting plate 113. When each rotating buckle 330 rotates in the corresponding rotating groove 112 until the second rotating portion 332 is below the second limiting plate 113, the second bump 114 abuts against the first bump 334, avoiding separation of the alignment plate 113 from the second rotating portion 332. That is, the constant engagement of the second bump 114 and the first bump 334 prevents the housing assembly 100 from being separated from the mounting base 300.

Referring to FIG. 12, in at least one embodiment, in order to increase the internal space of the shielding cavity 220, a portion of the second portion 12 is concaved away from the first portion 11.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A base station for mounting on a ceiling, comprising:
   a housing assembly comprising a first housing and a second housing connected to the first housing, wherein the first housing comprises a first portion, a second portion, and a third portion connected between the first portion and the second portion, the first portion and the second portion are disposed on opposite surfaces of the third portion, the third portion defines a cable hole; and
   a shielding assembly disposed on the second portion and connected to the second portion or the third portion, wherein the shielding assembly, the second portion, and the third portion cooperatively define a shielding cavity, the shielding cavity has an opening facing an exterior of the base station, the shielding cavity is configured to receive an external cable that is inserted into the cable hole;
   wherein the shielding assembly comprises a shielding plate, two first plates, and a first magnet, the two first plates are respectively connected to opposite ends of the shielding plate and face the third portion, the first magnet is disposed on one of the two first plates, a second magnet is provided on the third portion, the first magnet and the second magnet are configured to attract each other to fix the shielding assembly to the third portion;
   wherein the shielding plate comprises an inner surface facing the third portion, the shielding assembly further comprises two second plates, each of the two second plates connects the inner surface to a corresponding one of the two first plates, each of the two first plates, the corresponding one of the two second plates, and the inner surface cooperatively define a first receiving cavity for receiving the first magnet, one of the two first plates defines a first opening for exposing the first magnet.

2. The base station according to claim 1, wherein a buckle is provided on a bottom edge of the inner surface, an edge of the second portion away from the third portion defines a buckle groove for receiving the buckle.

3. The base station according to claim 1, wherein the shielding plate further comprises a first surface connected to a top edge of the inner surface and a second surface connected to a bottom edge of the inner surface, the first surface and the third portion cooperatively define the opening, the second surface faces the second portion, a port is defined by the second surface and a junction of the inner surface and the third portion, a size of the opening is smaller than a size of the port.

4. The base station according to claim 1, wherein the first receiving cavity has a mounting port facing the second portion, the shielding assembly further comprises a mounting portion, the mounting portion comprises a fixing plate and a supporting plate mounted on the fixing plate, the fixing plate is fixed in the mounting port, the supporting plate extends into the first receiving cavity, the first magnet is abutted between the supporting plate and the corresponding one of the two first plates.

5. The base station according to claim 4, wherein the shielding plate further comprises a hollow post received in the first receiving cavity, the hollow post protrudes from the inner surface and extends in a direction perpendicular to the second portion, the mounting portion further comprises a fastener, the fastener passes through the fixing plate and is then fixedly inserted into the hollow post.

6. The base station according to claim 4, wherein the first magnet comprises a first magnetic block and a second magnetic block protruding from the first magnetic block, the first magnetic block is abutted between the supporting plate and the corresponding one of the two first plates, the second magnetic block is received in the first opening.

7. The base station according to claim 6, wherein a first limiting plate is provided on the first portion and disposed on a side of the third portion away from the shielding plate, the first limiting plate and the third portion cooperatively define a second receiving cavity with an opening facing the second housing, the second magnet is received in the second receiving cavity, the third portion further defines a second opening for exposing the second magnet.

8. The base station according to claim 7, wherein the second magnet comprises a third magnetic block and a fourth magnetic block protruding from the third magnetic block, the third magnetic block is received in the second receiving cavity, the fourth magnetic block is exposed from the second opening.

9. The base station according to claim 8, wherein a fastening plate is provided on a surface of the second housing facing the first housing, the fastening plate extends into the second receiving cavity, the third magnetic block is clamped between the third portion and the fastening plate.

10. The base station according to claim 6, wherein a first adhesive layer is applied between the first magnetic block and the corresponding one of the two first plates.

11. The base station according to claim 1, wherein a positioning protrusion is provided on each of the two first plates, the third portion defines a positioning groove for receiving each positioning protrusion.

12. The base station according to claim 1, wherein the inner surface is an arc surface concaved inwardly.

13. The base station according to claim 1, wherein a portion of the second portion is concaved away from the first portion.

14. The base station according to claim 1, further comprising a mounting base, wherein the mounting base comprises a base plate and a rotating buckle protruding from the base plate, the first portion defines a rotating groove, the rotating buckle is received and configured to rotate in the rotating groove, thereby fixing the housing assembly to the mounting base.

15. The base station according to claim 14, wherein the mounting base further comprises a positioning column protruding from the base plate, the first portion further defines a central hole for receiving the positioning column, the central hole is at a center of a circle defined by the rotating groove.

16. The base station according to claim 14, wherein the rotating groove comprises a first end and a second end, the first end and the second end are disposed along a rotating direction of the rotating buckle, the first portion further comprises a second limiting plate covering the second end, the second limiting plate comprises a limiting end facing the first end;

the rotating buckle comprises a first rotating portion, a second rotating portion, and a clamping portion, an end of the first rotating portion is fixed on the base plate, the second rotating portion is connected to the other end of the first rotating portion, an end of the clamping portion is fixed on the base plate, the other end of the clamping portion is connected to the second rotating portion; the clamping portion is configured to abut against the limiting end when the second rotating portion is below the second limiting plate.

17. The base station according to claim 16, wherein a first bump is provided on a surface of the second rotating portion facing the second limiting plate, a second bump is provided on the second limiting plate, the second bump is configured to abut against the first bump.

* * * * *